(12) United States Patent
Tsuji et al.

(10) Patent No.: US 9,728,606 B2
(45) Date of Patent: Aug. 8, 2017

(54) SILICON CARBIDE SEMICONDUCTOR ELEMENT AND FABRICATION METHOD THEREOF

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Takashi Tsuji, Tsukuba (JP); Akimasa Kinoshita, Tsukuba (JP); Kenji Fukuda, Tsukuba (JP)

(73) Assignees: FUJI ELECTRIC CO., LTD., Kawasaki-shi (JP); NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 14/389,041

(22) PCT Filed: Mar. 18, 2013

(86) PCT No.: PCT/JP2013/057738
§ 371 (c)(1),
(2) Date: Sep. 29, 2014

(87) PCT Pub. No.: WO2013/146444
PCT Pub. Date: Oct. 3, 2013

(65) Prior Publication Data
US 2015/0076520 A1    Mar. 19, 2015

(30) Foreign Application Priority Data
Mar. 30, 2012 (JP) ................. 2012-082243

(51) Int. Cl.
*H01L 29/15* (2006.01)
*H01L 29/16* (2006.01)
(Continued)

(52) U.S. Cl.
CPC ...... *H01L 29/1608* (2013.01); *H01L 21/3043* (2013.01); *H01L 21/3065* (2013.01);
(Continued)

(58) Field of Classification Search
CPC ................. H01L 29/1608; H01L 29/1095
(Continued)

(56) References Cited

U.S. PATENT DOCUMENTS

2007/0210316 A1   9/2007  Yonezawa et al.
2009/0223539 A1*  9/2009  Gibbel .................. H01L 31/18
                                                                          134/2
2013/0210215 A1*  8/2013  Xue ...................... H01L 21/568
                                                                          438/462

FOREIGN PATENT DOCUMENTS

JP    2001-338932 A    12/2001
JP     2002-26069 A     1/2002
(Continued)

OTHER PUBLICATIONS

NPL Machine Translation 2006-156658.*
(Continued)

*Primary Examiner* — Trung Q Dang
*Assistant Examiner* — Patricia Reddington
(74) *Attorney, Agent, or Firm* — Westerman, Hattori, Daniels & Adrian, LLP

(57) ABSTRACT

In a fabrication method of a silicon carbide semiconductor element including a drift layer playing a role of retaining a high withstand voltage on a front side of a semiconductor substrate of silicon carbide and including an ohmic electrode on a backside, dicing is added to form at least one dicing line
(Continued)

in an element active region on a surface of the semiconductor substrate on a side opposite of the drift layer before forming the ohmic electrode on the backside of the semiconductor substrate. Thus, a silicon carbide semiconductor element and fabrication method thereof is provided such that even if the semiconductor substrate is made thinner to reduce the on-resistance, the strength of the substrate can be maintained and cracking of the wafer during wafer processing can be reduced.

3 Claims, 8 Drawing Sheets

(51) Int. Cl.
H01L 29/872 (2006.01)
H01L 29/66 (2006.01)
H01L 21/78 (2006.01)
H01L 21/304 (2006.01)
H01L 21/3065 (2006.01)
H01L 29/10 (2006.01)
H01L 29/417 (2006.01)
H01L 29/78 (2006.01)
H01L 29/08 (2006.01)
H01L 29/868 (2006.01)
H01L 29/06 (2006.01)
H01L 29/739 (2006.01)

(52) U.S. Cl.
CPC .......... H01L 21/78 (2013.01); H01L 29/0657 (2013.01); H01L 29/0886 (2013.01); H01L 29/1095 (2013.01); H01L 29/41766 (2013.01); H01L 29/6606 (2013.01); H01L 29/66712 (2013.01); H01L 29/7802 (2013.01); H01L 29/872 (2013.01); H01L 29/0619 (2013.01); H01L 29/7395 (2013.01); H01L 29/868 (2013.01)

(58) Field of Classification Search
USPC .......................................................... 257/77
See application file for complete search history.

(56) References Cited

FOREIGN PATENT DOCUMENTS

| JP | 2004-22878 A | | 1/2004 |
|---|---|---|---|
| JP | 2005-5428 A | | 1/2005 |
| JP | 2005-260267 A | | 9/2005 |
| JP | 2006-156658 A | | 6/2006 |
| JP | 2006156658 A | * | 6/2006 |
| JP | 2007-243080 A | | 9/2007 |
| JP | 2010-103208 A | | 5/2010 |
| JP | 2010-118573 A | | 5/2010 |
| JP | 2010-192491 A | | 9/2010 |
| JP | 2012-64656 A | | 3/2012 |

OTHER PUBLICATIONS

English translation of International Preliminary Report on Patentability (Form PCT/IPEA/409) of International Application No. PCT/JP2013/057738 with Form PCT/IB/338 mailed Oct. 9, 2014 (5 pages).
International Search Report dated Jun. 18, 2013, issued in corresponding application No. PCT/JP2013/057738.
Office Action dated Sep. 8, 2015, issued in counterpart Japanese Application No. 2012-082243, with partial English translation (4 pages).

* cited by examiner

SILICON CARBIDE SEMICONDUCTOR ELEMENT AND FABRICATION METHOD THEREOF

TECHNICAL FIELD

The present invention relates to a silicon carbide semiconductor element using silicon carbide (hereinafter also referred to as "SiC") as semiconductor material and particularly to a vertical silicon carbide semiconductor element to which current is applied from the front side to the back side and a fabrication method thereof.

BACKGROUND ART

Power semiconductor elements, i.e., power devices, are key devices in power electronic circuits having frequency/voltage/current control and conversion functions and continuous efforts are made to reduce power loss of the power devices. The power devices include transistors and diodes, and transistors include metal-oxide-semiconductor field effect transistors (MOSFETs) and insulated gate bipolar transistors (IGBTs) while diodes include pin diodes and Schottky barrier diodes (SBDs), and an optimum element is used depending on the operating frequency, voltage, and current.

For example, taking a Schottky barrier diode (SBD) as an example, the structure of the power device is made up of a drift layer playing a role of a high withstand voltage region retaining high withstand voltage, a substrate with mechanical strength, anode metal having an optimum Schottky barrier disposed on the front side, and cathode metal having ohmic contact with a semiconductor region deposed on the back side.

FIG. 1 is a schematic cross-sectional view of an example of a structure of a Schottky barrier diode (SBD) using silicon carbide (4H—SiC) for a substrate. In FIG. 1, reference numeral 1 denotes an SiC substrate; reference numeral 2 denotes an n-type epitaxial layer acting as the drift layer grown on the SiC substrate 1; reference numeral 3 is a junction barrier Schottky (JBS) structure consisting of a p-type region formed by aluminum (Al) ion implantation; reference numeral 4 denotes a peripheral edge portion of an active region consisting of a p-type region formed for the purpose of improving the element withstand voltage; reference numeral 5 denotes a field oxide film consisting of a thermal oxide film (deposition oxide film) formed on the front side of the substrate 1; reference numeral 6 is an ohmic electrode (ohmic alloy layer) disposed on the back surface of the SiC substrate 1; reference numeral 7 denotes a Schottky electrode disposed on the front surface of the SiC substrate 1; reference numeral 8 denotes an Al electrode for bonding with an Al wire disposed on the front surface of the SiC substrate 1; and reference numeral 9 denotes lamination metal for improving adhesiveness with solder.

During conduction when current is applied from an anode to a cathode in such a Schottky barrier diode (SBD), each of the constituent elements acts as resistance and the sum of the resistance in terms of a unit area is referred to as on-resistance. Drift layer resistance accounting for a large proportion of the on-resistance is inversely proportional to the cube of insulation breakdown field intensity specific to semiconductor material. Silicon carbide with 4H type crystal architecture (4H—SiC) has a large band gap of 3.25 eV and therefore, has an insulation breakdown field intensity of 2 to 3 MV/cm, which is about ten times larger than insulation breakdown field intensity of silicon (Si) (0.2 to 0.3 MV/cm), which has been widely used. Therefore, if the 4H—SiC semiconductor is used, the drift layer resistance can be suppressed to several hundredths as compared to silicon semiconductors. A power device using the 4H—SiC semiconductor also has high thermal conductivity characteristics facilitating heat radiation and therefore, is expected as a next-generation low-loss power device (see, e.g., Patent Document 1).

However, although the drift layer resistance can be reduced significantly by using the 4H—SiC semiconductor, if the drift layer resistance is reduced, other resistance components then become conspicuous. One of the components is a substrate resistance. The 4H—SiC semiconductor generally has a specific resistance of 20 mΩcm and a thickness of 350 μm and therefore is resistance of about 0.7 mΩcm$^2$. Since a power device with the drift resistance on the order of 600 to 1200 V has a substrate resistance of 1 to 2 mΩcm$^2$, it is problematic that the substrate resistance is no longer negligible.

A power device mainly made of silicon has the same technical problem. To reduce the contribution of a drift layer to the on-resistance of FZ—Si wafers used as semiconductor substrates, a wafer-thinning process technique has been developed so as to achieve a minimum thickness of the drift layer required for the withstand voltage. The thickness of the drift layer determining the withstand voltage is dependent on a physical property of semiconductor material and, for example, in the case of silicon, the thickness is about 70 μm for withstand voltage of 600 V and about 100 μm for withstand voltage of 1200 V. In development of the semiconductor manufacturing process using FZ—Si wafers, one of the final goals is to establish a technique of processing a thin wafer polished to a thickness necessary for withstand voltage, for example, a wafer with a thickness of about 70 μm and considerable advances have been made such as an improvement in a method of wafer handling for handling a thin wafer (see, e.g., Patent Document 2).

With regard to a silicon carbide semiconductor device using silicon carbide, after a semiconductor layer is deposited and formed on a silicon carbide substrate, the substrate is polished to a thickness equal to or less than 200 μm so as to reduce the on-resistance in a known invention (see, e.g., Patent Document 3). However, Patent Document 3 only discloses a semiconductor device with a thickness of a silicon carbide substrate reduced from 400 μm to about 200 μm and a fabrication method thereof and includes no description about the lower limit of thickness. In a first embodiment described in Patent Document 3, to fabricate a Schottky diode, after an epitaxial growth layer with a thickness of 10 μm is deposited on the silicon carbide substrate, boron ions are implanted to form an impurity layer and an electrode is formed thereon. When the fabrication method disclosed in Patent Document 3 is used, if the thickness of the silicon carbide substrate is made thinner than 200 μm to, for example, a thickness of 100 μm or 50 μm, it is considered that problems such as cracking of the substrate occur as is the case with a manufacturing process using silicon as described above. Therefore, although a semiconductor device with a silicon carbide substrate having a thickness equal to or less than 200 μm is literally disclosed, specifically, Patent Document 3 only discloses a fabrication method of setting a thickness of the silicon carbide substrate to about 200 μm by polishing, etc.

Patent Document 1: Japanese Laid-open Patent Publication No. 2005-5428

Patent Document 2: Japanese Laid-open Patent Publication No. 2005-260267

Patent Document 3: Japanese Laid-open Patent Publication No. 2004-22878

Patent Document 4: Japanese Laid-open Patent Publication No. 2007-243080

DISCLOSURE OF INVENTION

Problem to be Solved by the Invention

A semiconductor device mainly made of silicon carbide or gallium nitride has an avalanche breakdown limit higher than silicon, and a thickness of a withstand voltage region of a power device having a design withstand voltage of 600 to 1200 V may be about 10 μm or less. On the other hand, a volume resistivity of a low-resistance substrate formed of currently available silicon carbide is higher as compared to a silicon substrate. For example, in the case of silicon, a wafer with a resistivity less than 0.0001 Ωcm is available; however, in the case of silicon carbide, a wafer is only available that has a resistivity of 0.02 to 0.01 Ωcm, which is ten or more times larger. If nitrogen atoms added as n-type impurities in a silicon carbide substrate are added in excessive concentration, the 4H—SiC crystalline quality deteriorates, resulting in an increase in screw dislocation, edge dislocation, and stacking fault in the silicon carbide substrate and causing a problem of degradation of the element withstanding voltage.

When a semiconductor device mainly made of gallium nitride is manufactured, since it is difficult to obtain a single-crystal substrate formed of gallium nitride, a method is employed to form a semiconductor layer of gallium nitride with a hetero-epitaxial growth method on a substrate of silicon carbide or sapphire. However, currently available silicon carbide substrates have a volume resistivity of about 0.01 Ωcm, and a reduction in the volume resistivity of the silicon carbide substrate requires further technical development and is expected to be difficult.

In consideration of the situations described above, it is estimated that establishment of a process of thinning a semiconductor substrate or a wafer eventually becomes essential for reduction of the on-resistance even in a vertical power semiconductor device mainly made of silicon carbide or gallium nitride as is the case with a vertical power semiconductor device mainly made of silicon. As mentioned in the background art section, a semiconductor device mainly made of silicon carbide or gallium nitride can achieve a withstand voltage of about 1000 V with the withstand voltage region having a thickness of about 10 μm. Therefore, for example, a fabrication method is conceivable in which a substrate formed of silicon carbide is made thinner to a thickness necessary for the withstand voltage, for example, about 10 μm, for the purpose of reducing the on-resistance, as is the case with the silicon process. However, if it is attempted to polish the semiconductor substrate or wafer to a thinner thickness of about 10 μm, defects such as cracking and chipping and numerous particles are inevitably generated and it is estimated that a favorable fabrication process is difficult to establish. Since the silicon semiconductor device has the withstand voltage region with thickness of 70 μm for 600 V and 100 μm for 1200 V, a process of making the entire wafer thinner is possible.

To deal with such a problem, a method is proposed in which a center portion of a substrate back surface is formed into a concave shape so as to form a metal electrode in this concave portion (see, e.g., Patent Document 4). Since only a partial region under an element active portion of the substrate back surface is made thinner instead of the entire substrate back surface, a thick portion remains with a thickness not made thinner in a substrate outer peripheral portion and therefore, the mechanical strength of the wafer can be increased in terms of a supporting body. In Patent Document 4, reactive ion etching (RIE), sandblasting, focused ion beam (FIB), etc. are proposed as a thinning method. However, in the method of thinning with RIE, an etching rate is generally 1 μm/min and therefore, it takes 300 minutes for grinding a thickness of 300 μm. Since a selection ratio to nickel (Ni) generally used as mask material is about several dozen, a very thick Ni film with a thickness of about 10 μm must be formed for etching of a thickness of 300 μm. Thus, thinning with RIE is difficult. In the method of thinning with sandblasting, since a selection ratio to a mask is substantially one and a thickness of the mask must be several hundred μm, it is difficult to form a mask and a mask pattern. In the method of thinning with FIB, since FIB can thin a region of several dozen μm, which is a very small area as compared to a wafer area, pattern formation of the entire wafer surface is impractical. As described above, Patent Document 4 has a problem in a thinning method.

The present invention was conceived in view of the background art and the problems described above. It is an object of the present invention to reduce on-resistance of a silicon carbide semiconductor element having a semiconductor layer of silicon carbide on a semiconductor substrate and to provide a silicon carbide semiconductor element having a structure capable of maintaining substrate strength and reducing wafer cracking in a wafer process even if the semiconductor substrate is made thinner to reduce the on-resistance, and a fabrication method thereof.

Means for Solving Problem

As a result of intensive studies for achieving an object, the present inventors found that resistance of a semiconductor substrate is reduced while the mechanical strength of the semiconductor substrate is maintained by forming dicing lines only in the semiconductor substrate with a dicing saw on the backside of the semiconductor substrate. It is also discovered that the mechanical strength of the semiconductor substrate is further improved when the dicing lines are formed from one end of the semiconductor substrate in a certain direction so as not to reach the other end on the opposite side. It is also found that the entire surface of the semiconductor substrate is preferably made thinner by making a distance between dicing lines smaller than a width of a dicing line in this case. It is also learned that after dicing, processes of RIE and sacrificial oxidation are preferably added for removing damages of the dicing.

The present invention was conceived based on the knowledge above and, according to the present invention, the following aspects of the invention will be provided.

To solve the problems above and achieve an object, a fabrication method of a silicon carbide semiconductor element according to the present invention has the following characteristics. The silicon carbide semiconductor element includes a drift layer playing a role of retaining a high withstand voltage on a front side of a semiconductor substrate of silicon carbide and includes an ohmic electrode on a backside. The fabrication method includes forming one or more slit-shaped grooves in an element active region on a surface of the semiconductor substrate on a side opposite of the drift layer before forming the ohmic electrode on the backside of the semiconductor substrate.

In the fabrication method of the silicon carbide semiconductor element according to the present invention, the one or more slit-shaped grooves are formed by a dicing blade.

In the fabrication method of the silicon carbide semiconductor element according to the present invention, the dicing blade is applied in a certain direction of the semiconductor substrate, and the dicing blade is separated from the semiconductor substrate before reaching a substrate end on a side opposite to an incident direction of the dicing blade.

In the fabrication method of the silicon carbide semiconductor element according to the present invention, a distance between the one or more slit-shaped grooves is made smaller than a width of the dicing blade such that an entire surface on the backside of the semiconductor substrate is made thinner leaving a substrate end remaining only in a certain direction.

In the fabrication method of the silicon carbide semiconductor element according to the present invention, processes of RIE and sacrificial oxidation are added for removing damage occurring with the forming of the one or more slit-shaped grooves.

To solve the problems above and achieve an object, a silicon carbide semiconductor element according to the present invention has the following characteristics. The silicon carbide semiconductor element includes a drift layer playing a role of retaining a high withstand voltage on a front side of a semiconductor substrate of silicon carbide and includes an ohmic electrode on a backside. The semiconductor substrate has a substrate resistance reduced by providing one or more slit-shaped grooves in an element active region on a surface on a side opposite of the drift layer, and the one or more slit-shaped grooves are provided from a certain end of the semiconductor substrate in one direction and are formed with a substrate end remaining at least on a side opposite of the certain end of the semiconductor substrate.

Effect of the Invention

A silicon carbide semiconductor element and a fabrication method thereof of the present invention produce effect that substrate resistance can be reduced by up to 0.5 mΩcm$^2$ and that a voltage reduction of about 0.2 V can be achieved at a current density of 400 A/cm$^2$ in terms of forward characteristics.

BEST MODE(S) FOR CARRYING OUT THE INVENTION

A method of the present invention is characterized in having a step of dicing such that at least one dicing line is formed on a back surface of a semiconductor substrate before forming an ohmic electrode on the backside of the semiconductor substrate in a fabrication method of a silicon carbide semiconductor element having a drift layer playing a role of retaining a high withstand voltage on the front side of a semiconductor substrate of silicon carbide and having an ohmic electrode on the backside.

Figure 1:
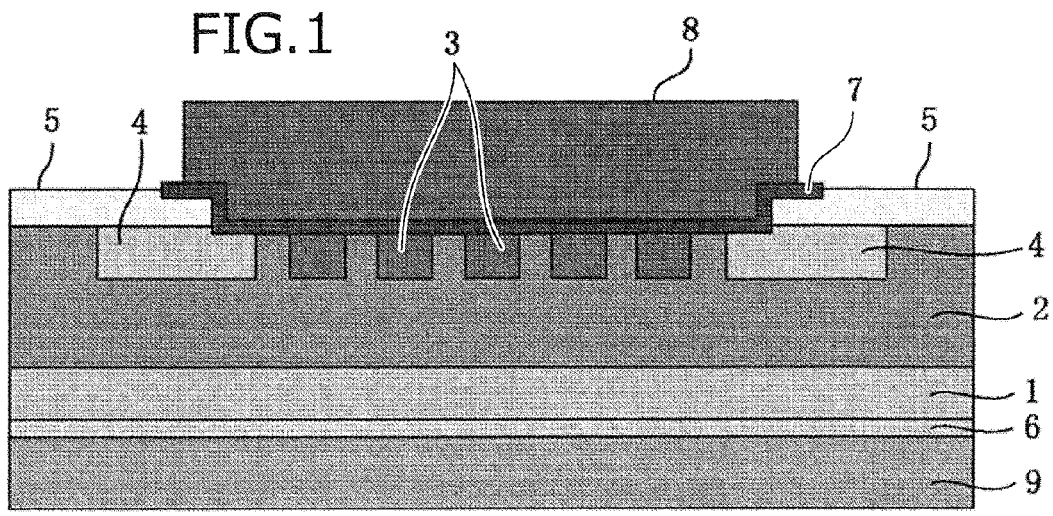
FIG. 1 is a schematic cross-sectional view of an example of a structure of a Schottky barrier diode (SBD) using silicon carbide for a substrate.

First, description will be made of an example of the fabrication method of a silicon carbide semiconductor element including a drift layer playing a role as a withstand voltage region retaining a high withstand voltage on the front side of a semiconductor substrate of silicon carbide and including an ohmic electrode on the backside with reference to FIG. 1 described above.

A 4H—SiC substrate (hereinafter referred to as the SiC substrate) 1 is prepared and an n-type epitaxial layer 2 acting as the drift layer is grown thereon. The concentration of impurities such as nitrogen atoms added as n-type impurities in this case and the thickness of the later to be grown differ depending on the withstand voltage class and, in the case of an element of a 600 to 1200 V class, in general, the concentration of impurities is set to a first half of $1 \times 10^{16}$ cm$^{-3}$ level and the layer thickness is set to 5 to 10 μm. In a surface layer of the n-type epitaxial layer 2 in an element active region on the SiC substrate 1 with the n-type epitaxial layer 2 grown thereon, a JBS structure 3 is selectively formed by Al ion implantation. The JBS structure 3 is for reducing leak current during the opposite direction. For the purpose of improving the element withstand voltage, Al ion implantation is performed into peripheral edge portion 4 of the active region such that a dose amount of $10^{12}$ to $10^{13}$ cm$^{-2}$ is achieved. Al of the ion implantation is annealed and electrically activated at a temperature around 1600 degrees C. The front surface of the SiC substrate 1 is coated with the thermal oxide film (a deposition oxide film, the field oxide film) 5. The ohmic electrode (ohmic alloy layer) 6 is formed on the back surface of the SiC substrate 1, and the Schottky electrode 7 and the Al electrode 8 for bonding with an Al wire are sequentially formed on the front surface of the SiC substrate 1. The lamination metal 9 for increasing adhesiveness with solder is subsequently formed on the back surface of the SiC substrate 1, and a preprocessing step for fabricating the silicon carbide semiconductor element depicted in FIG. 1 is terminated.

In the present invention, before the step of forming the ohmic electrode 6 on the backside of the SiC substrate 1 described above, i.e., after completion of the steps of growing the n-type epitaxial layer 2 acting as the drift layer on the SiC substrate 1, forming the JBS structure 3 and the peripheral edge portion 4 of the active region through the ion implantation of the p-type impurities, annealing for activation, and forming the field oxide film 5, the back surface of the SiC substrate 1 is diced by a dicing saw. The dicing in this case is performed by using a dicing blade such as a diamond blade, for example.

Figure 2:
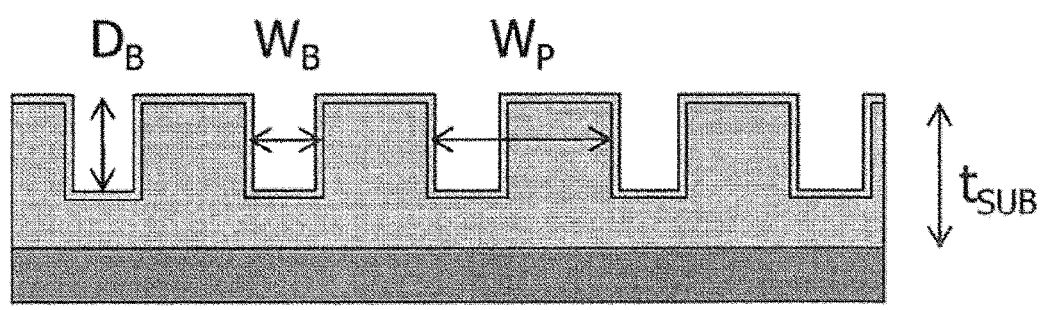
FIG. 2 is a schematic cross-sectional view of a cross section of a portion of a diced substrate.

In the present invention, the back surface of the SiC substrate 1 is diced to form at least one dicing line under an element active region. FIG. 2 is a schematic cross-sectional view of a cross section of a portion of a diced substrate. In FIG. 2, $W_B$, $D_B$, $W_P$, and $t_{SUB}$ denote a width of a dicing blade, a height (depth) of dicing, a dicing pitch, and a thickness of the SiC substrate 1, respectively. Although $W_B$, $D_B$, and $W_P$ can be determined arbitrarily in the present invention, the dicing blade width ($W_B$) is normally 60 μm, preferably 120 μm. When the dicing depth ($D_B$) is deeper, the substrate resistance can further be reduced; however, the dicing depth must be kept within a range not reaching the drift layer formed on the front side of the SiC substrate 1, i.e., within a range of the thickness ($t_{SUB}$) of the SiC substrate 1. When the dicing pitch ($W_P$) is smaller, the substrate resistance can further be reduced. Although the dicing pitch ($W_P$) can be made smaller than the dicing blade width ($W_B$) to grind the entire surface of the SiC substrate 1 for thinning, if the entire surface of the SiC substrate 1 is ground, an end portion of the SiC substrate 1 is preferably left uncut so as to maintain the mechanical strength as described later.

Figure 3:
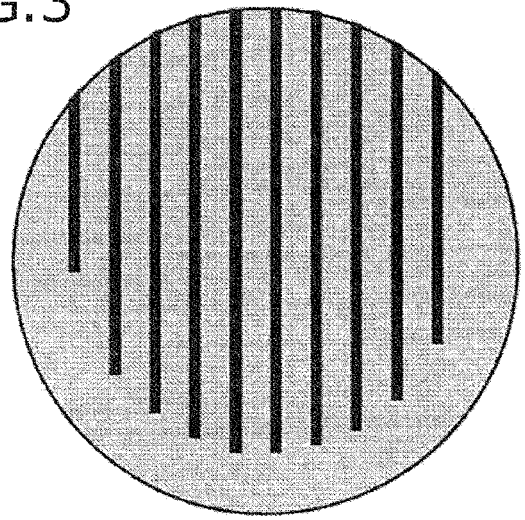
FIG. 3 is a plane view of an example of dicing lines that are cutting traces of dicing.

Although the direction and the shape of dicing are not particularly limited in the present invention, for example, the dicing may be formed in stripes in one direction of the SiC substrate 1 or may be formed in two orthogonal directions on the SiC substrate 1, i.e., in a lattice. FIG. 3 is a plane view of an example of dicing lines that are cutting traces of dicing. In the present invention, as depicted in FIG. 3, the dicing lines can be formed from one end of the SiC substrate 1 in a certain direction so as not to reach the other end on the opposite side such that an end portion of the SiC substrate 1 is left uncut, thereby further improving the mechanical strength of the SiC substrate 1.

Figure 4:
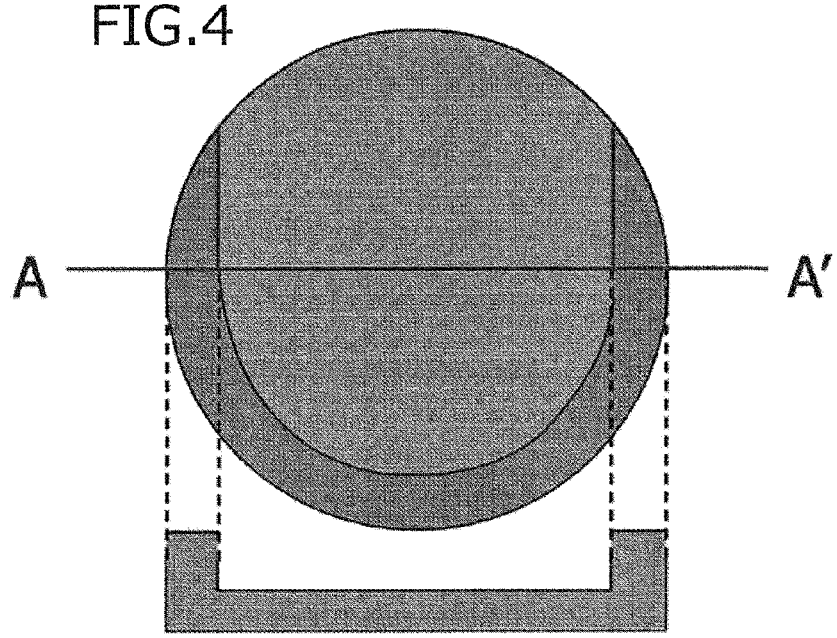
FIG. 4 is an explanatory view of making a dicing pitch ($W_P$) smaller than a dicing blade width ($W_B$) so that an entire surface of a SiC substrate 1 can be ground with an end portion of the SiC substrate 1 left.

FIG. 4 is an explanatory view of making the dicing pitch ($W_P$) smaller than the dicing blade width ($W_B$) so that the entire surface of the SiC substrate 1 can be ground with an end portion of the SiC substrate 1 left. A method depicted in FIG. 4 is achieved by further developing the method depicted in FIG. 3 and the dicing is performed in one direction such that an end portion of the SiC substrate 1 remains as is the case with the method depicted FIG. 3; however, in a cross section along a section line A-A', as depicted in FIG. 2, the dicing pitch ($W_P$) is made smaller than the dicing blade width ($W_B$) so that the entire surface of the SiC substrate 1 can be ground.

Figure 5:
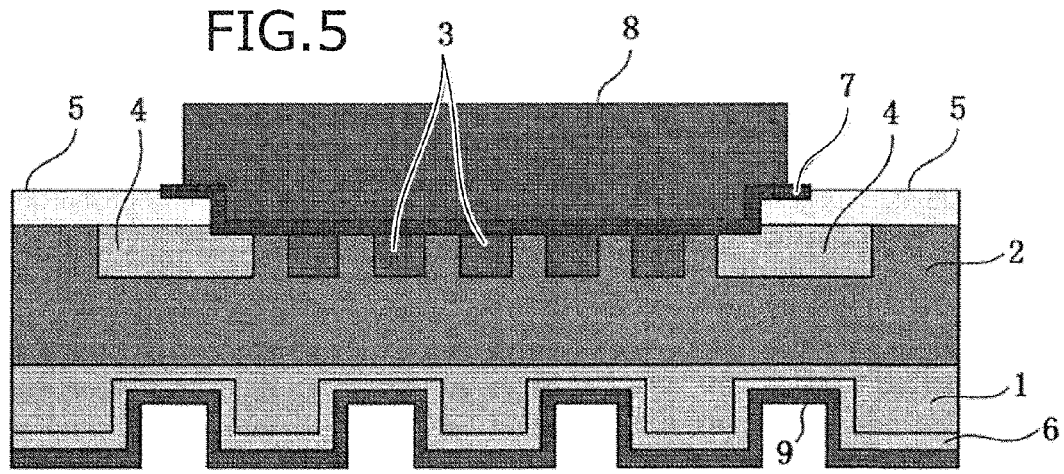
FIG. 5 is a schematic cross-sectional view of an element, depicting an appearance of a Schottky barrier diode completed by the method of the present invention.

FIG. 5 is a schematic cross-sectional view of an element, depicting an appearance of a Schottky barrier diode completed by the method of the present invention. FIG. 5 depicts an appearance of the Schottky barrier diode completed by sequentially performing a step of forming the ohmic electrode (ohmic metal) 6, a step of forming a contact hole for Schottky metal, a step of forming the Schottky electrode (Schottky metal) 7, a step of forming the Al electrode (top Al metal) 8, and a step of forming the lamination metal (back-surface three-layer metal) 9 after forming at least one dicing line under the element active region on the backside of the SiC substrate 1 in the method as depicted in FIG. 3 or 4.

In the present invention, after dicing, processes of reactive ion etching (RIE) and sacrificial oxidation are preferably added for removing damage of the dicing. The sacrificial oxidation is to thermally oxidize the SiC substrate 1 and immediately remove a thermal oxide film formed by the thermal oxidization with dilute hydrofluoric acid, etc. for removing a surface layer formed by the step of RIE and this thermal oxide film is temporarily formed for making the surface of the SiC substrate 1 clean and is called a sacrificial oxide film.

Although the fabrication method is described by taking an SBD as an example, the method of the present invention is applicable to any vertically-structured power devices such as MOSFETs, IGBTs, SBDs, and pin diodes.

Embodiment

Detailed description will hereinafter be made by taking the simply-structured Schottky barrier diode used in the description of the conventional technique as an example with reference to FIG. 1.

On the 4H—SiC substrate 1 having a diameter of 4 inches with a thickness of 350 μm and specific resistance of 20 mΩcm, the steps were performed as the step of growing the n-type epitaxial layer 2 acting as the drift layer, the step of forming the JBS structure 3 and the peripheral edge portion 4 of the active region through the ion implantation of the p-type impurities, the step of annealing for activation, and the step of forming the field oxide film 5, as described above. In this example, the nitrogen atom concentration at the ion implantation was $1 \times 10^{16}$ cm$^{-3}$, and the film thickness of the n-type epitaxial layer 2 was 10 μm. The back surface of the SiC substrate 1 was subsequently diced by a dicing saw. In this case, the dicing was performed by using a dicing blade such as a diamond blade. The width ($W_B$) of the dicing blade used in this example was 60 μm. The height ($D_B$) of the dicing and the dicing pitch ($W_P$) in this case were used as parameters to conduct experiments.

The dicing height ($D_B$) and the dicing pitch ($W_P$) were changed from 50 μm to 250 μm and from 100 μm to 1 mm, respectively. Two types of dicing directions were used for conducting the experiments in one direction and in two orthogonal directions. In the case of dicing in one direction, the dicing was performed from a certain direction and the dicing blade was pulled up to leave a cutting margin of 10 mm from the wafer outer circumferential end in the end portion on the opposite side (see FIG. 3).

The reactive ion etching using mixed gas of $CF_4$ and $O_2$ was then performed for removing a damage layer due to the dicing. The etching depth was 1 μm. The process of sacrificial oxidation was performed by two-hour dry oxidization at a temperature of 1100 degrees and, after the formation of a thermal oxide film of about 100 nm, the thermal oxide film was removed by dipping into buffered hydrofluoric acid solution.

Subsequently, the Schottky barrier diode was completed by sequentially performing the formation of the ohmic electrode 6, the formation of the contact hole for Schottky metal, the formation of the Schottky electrode 7, the formation of the Al electrode 8, and the formation of the lamination metal 9 as described in the conventional technique (see FIG. 5). The dicing step and the damage removal step of the back surface may be inserted into any step before forming the ohmic electrode 6.

Figure 6:
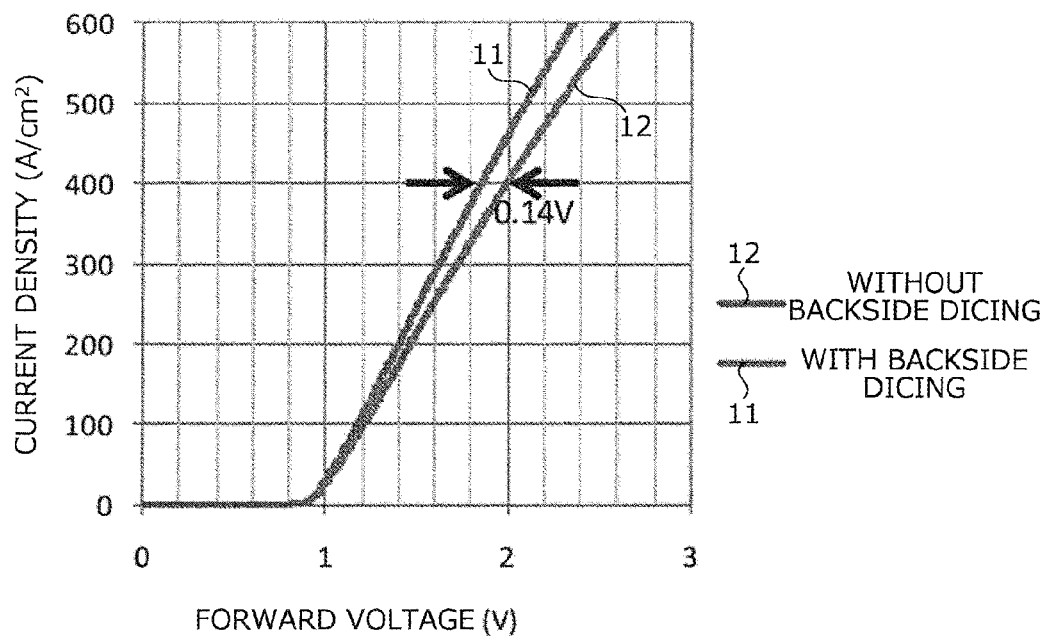
FIG. 6 is a characteristic diagram of forward IV characteristics without dicing and with a dicing pitch of 100 μm and a dicing depth of 300 μm.

In the forward IV characteristics of the SBD produced in this way, while a rising voltage is unchanged, a slope becomes steeper. FIG. 6 is a characteristic diagram of the forward IV characteristics without dicing and with a dicing pitch of 100 μm and a dicing depth of 300 μm. At a current density of 400 A/cm$^2$, a reduction in forward voltage by 0.14 V was realized. In FIG. 6, reference numeral 11 denotes the presence of the back surface dicing and reference number 12 denotes the absence of the back surface dicing.

Figure 7:
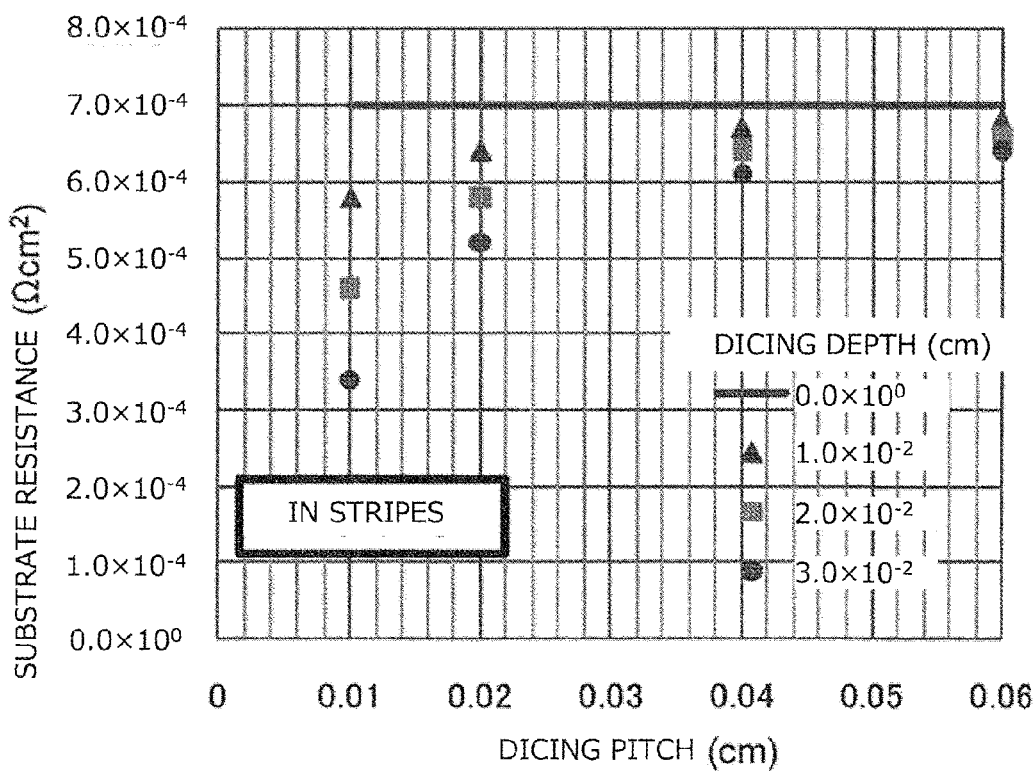
FIG. 7 is a characteristics diagram of substrate resistance in a case of performing dicing in stripes by using dicing pitch and dicing depth as parameters.
Figure 8:
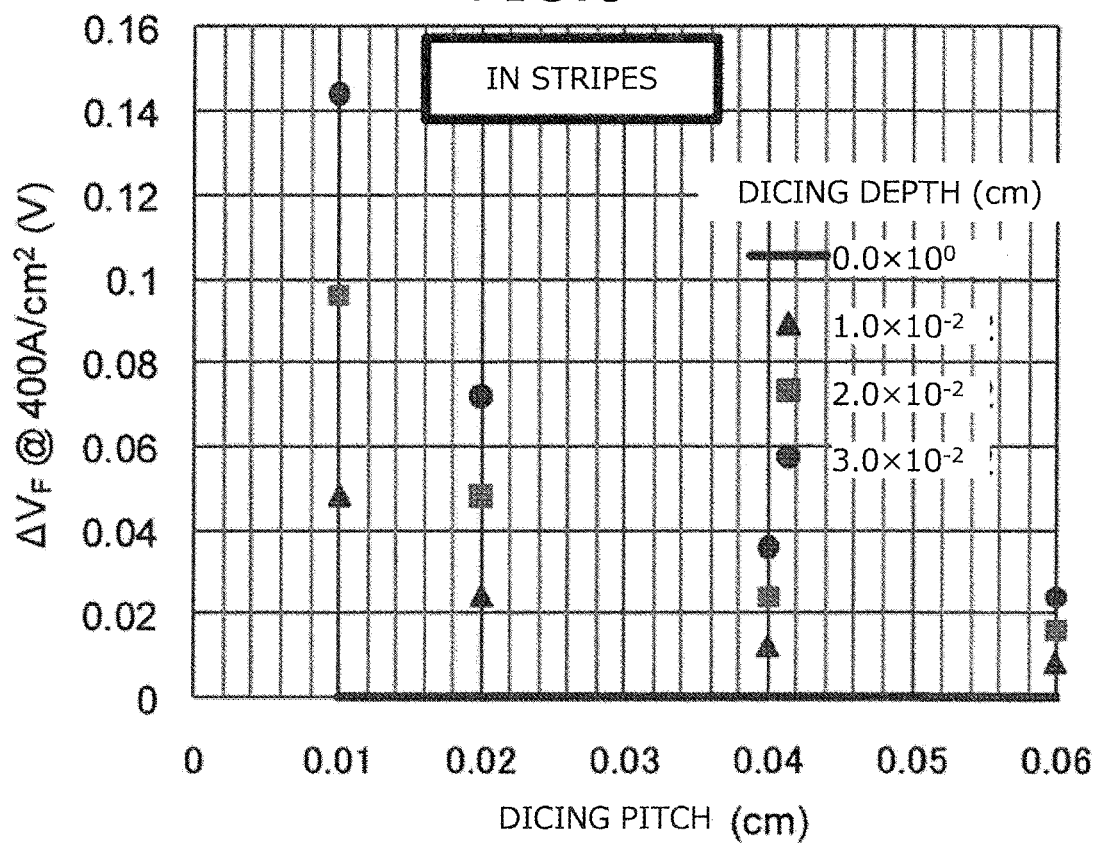
FIG. 8 is a characteristics diagram of a forward voltage reduction value at 400 A/cm$^2$ in a case of performing dicing in stripes by using dicing pitch and dicing depth as parameters.
Figure 9:
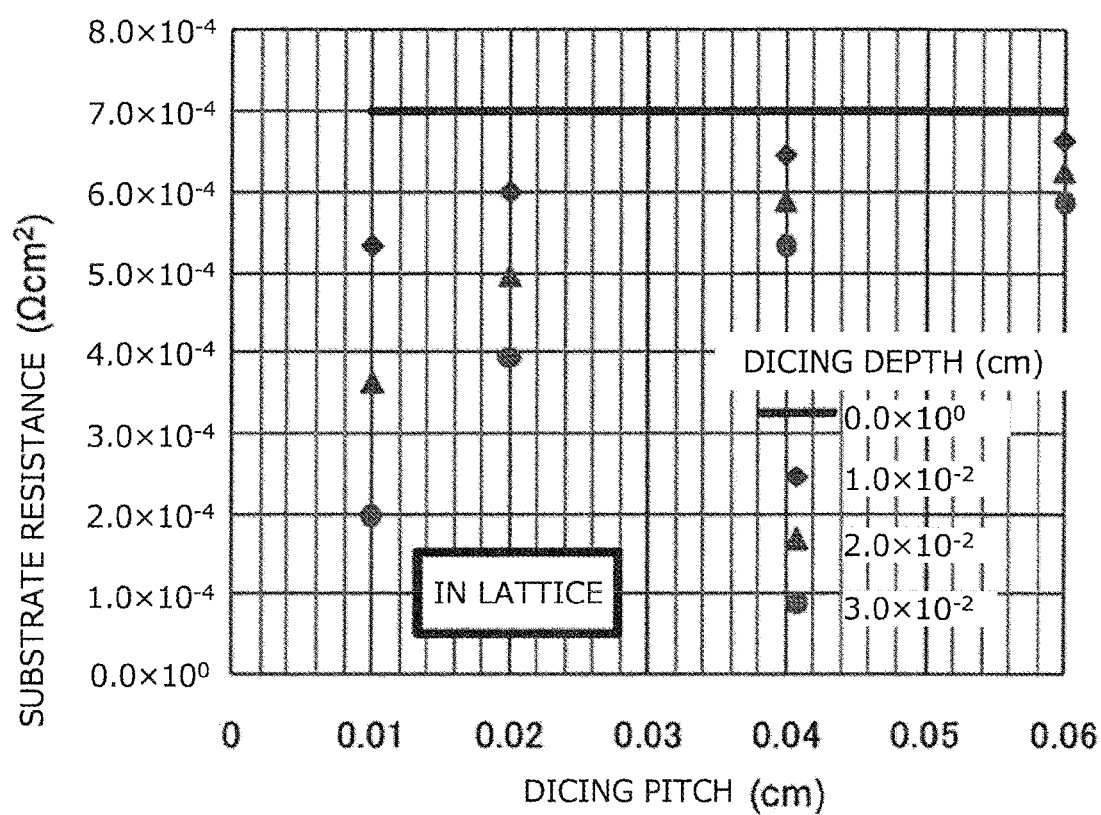
FIG. 9 is a characteristics diagram of substrate resistance in a case of performing dicing in a lattice by using dicing pitch and dicing depth as parameters.
Figure 10:
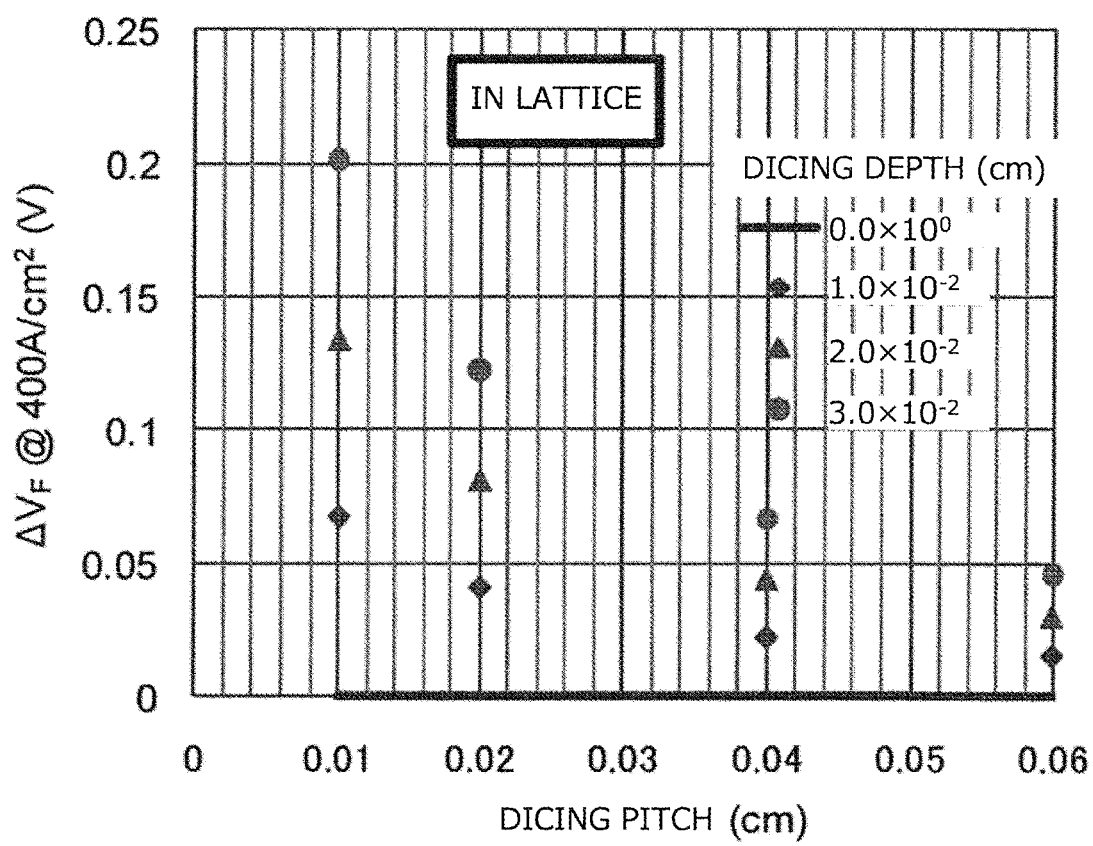
FIG. 10 is a characteristic diagram of the forward voltage reduction value at 400 A/cm$^2$ in a case of performing dicing in a lattice by using dicing pitch and dicing depth as parameters.

With reference to FIGS. 7 to 10, description will be made of forward voltage reduction values at 400 A/cm$^2$ in the cases of performing the dicing in stripes and performing the dicing in two orthogonal directions (in a lattice) by using the dicing pitch and the dicing depth as parameters. FIG. 7 is a characteristics diagram of substrate resistance in the case of performing the dicing in stripes by using the dicing pitch and the dicing depth as parameters. FIG. 8 is a characteristics diagram of the forward voltage reduction value at 400 A/cm$^2$ in the case of performing the dicing in stripes by using the dicing pitch and the dicing depth as parameters. FIG. 9 is a characteristics diagram of substrate resistance in the case of performing the dicing in a lattice by using the dicing pitch and the dicing depth as parameters. FIG. 10 is a characteristic diagram of the forward voltage reduction value at 400 A/cm$^2$ in the case of performing the dicing in a lattice by using the dicing pitch and the dicing depth as parameters.

FIGS. 7 and 8 depict the substrate resistance and the forward voltage reduction value at 400 A/cm$^2$, respectively, in the case of performing the dicing in stripes, and FIGS. 9 and 10 depict the substrate resistance and the forward voltage reduction value at 400 A/cm$^2$, respectively, in the case of performing the dicing in a lattice. As can be seen from FIGS. 7 to 10, when the dicing pitch is smaller or when the dicing depth is larger, the substrate resistance is further reduced. It is found that the substrate resistance is further reduced when stripes are defined in two directions rather than one direction.

Figure 11:
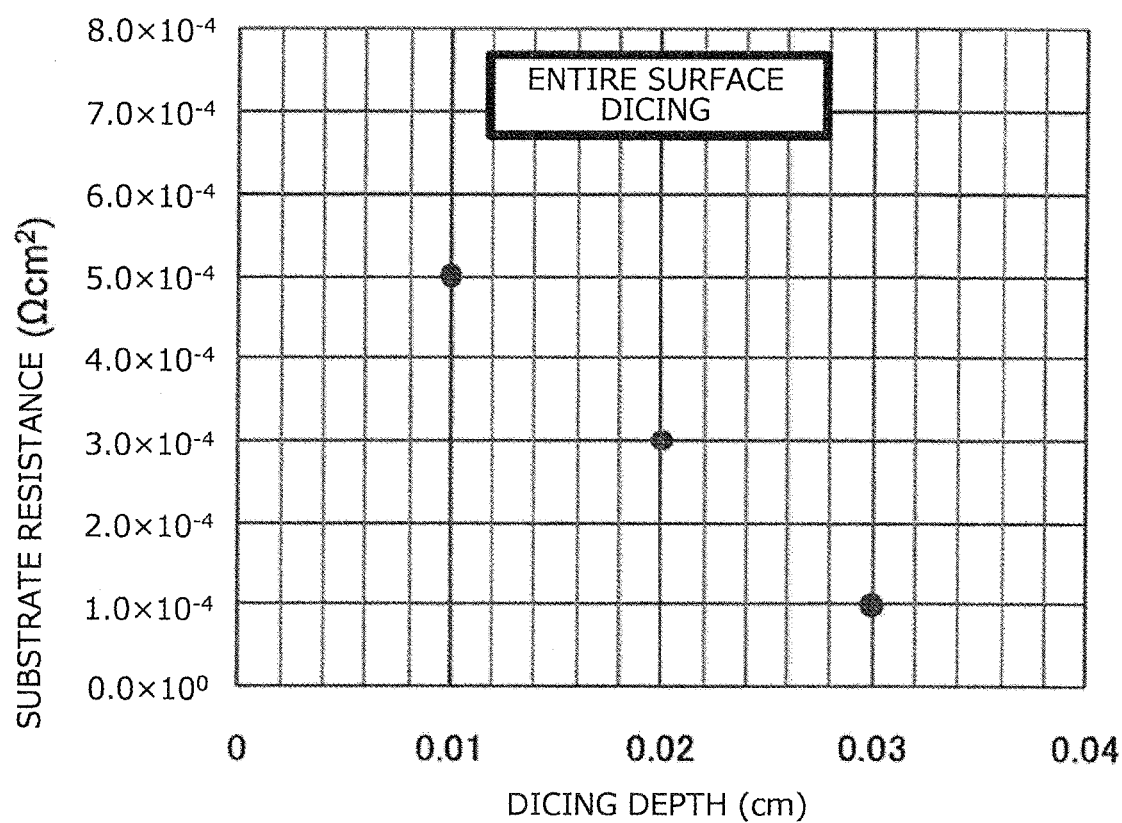
FIG. 11 is a characteristics diagram of dicing depth dependency of substrate resistance when the dicing pitch is made smaller than the dicing blade width.
Figure 12:
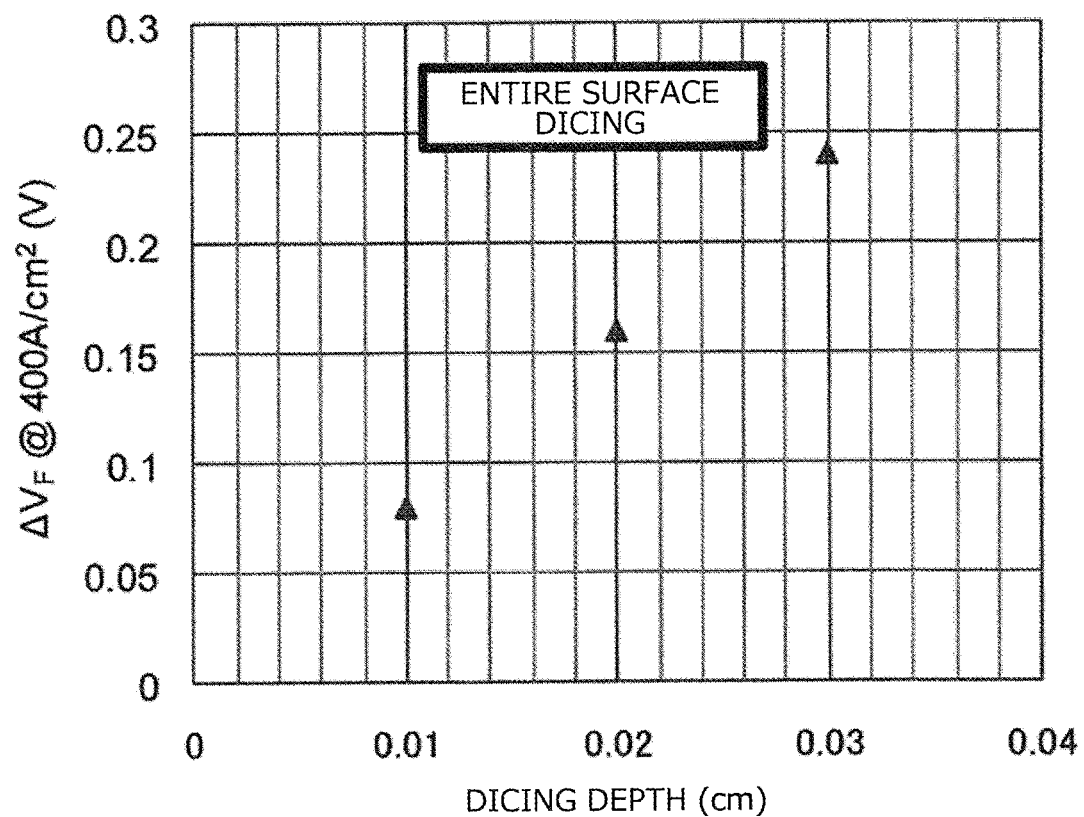
FIG. 12 is a characteristics diagram of the reduction value of forward voltage drop at 400 A/cm$^2$ when the dicing pitch is made smaller than the dicing blade width.

FIG. 11 is a characteristics diagram of dicing depth dependency of substrate resistance when the dicing pitch is made smaller than the dicing blade width. FIG. 12 is a characteristics diagram of the reduction value of forward voltage drop at 400 A/cm$^2$ when the dicing pitch is made smaller than the dicing blade width. As can be seen from FIGS. 11 and 12, when the dicing depth is deeper, the substrate resistance is further reduced, and the substrate resistance is 0.1 mΩcm$^2$ at the depth of 300 μm. Therefore, a larger amount of grinding of a substrate results in further reduction in substrate resistance.

INDUSTRIAL APPLICABILITY

As described above, a silicon carbide semiconductor element and a fabrication method thereof according to the present invention are useful for a vertical power semiconductor device used for a power semiconductor element.

EXPLANATIONS OF LETTERS OR NUMERALS

1 SiC substrate
2 n-type epitaxial layer
3 junction barrier Schottky (JBS) structure
4 peripheral edge portion
5 thermal oxide film (deposition oxide film)
6 ohmic electrode
7 Schottky electrode
8 Al electrode for bonding with an Al wire
9 lamination metal
$D_B$ dicing depth
$W_B$ dicing blade width
$W_P$ dicing pitch
$t_{SUB}$ substrate thickness

The invention claimed is:

1. A fabrication method of a silicon carbide semiconductor element that includes a drift layer playing a role of retaining a high withstand voltage on a front side of a semiconductor substrate of silicon carbide and including an ohmic electrode on a backside, the fabrication method comprising:

forming one or more slit-shaped grooves in an element active region on a surface of the semiconductor substrate on a side opposite of the drift layer before forming the ohmic electrode on the backside of the semiconductor substrate;

the one or more slit-shaped grooves are formed by a dicing blade; and the dicing blade is applied directly to a furthest most edge of a first end of the semiconductor substrate and across a certain direction of the semiconductor substrate which is perpendicular to a surface of the substrate contacting the drift layer, and the dicing blade is separated from the semiconductor substrate before reaching a second end of the semiconductor substrate on a side opposite to an incident direction of the dicing blade so as to maintain an un-diced substrate peripheral portion; and a distance between the one or more slit-shaped grooves is made smaller than a thickness of the dicing blade such that an entire surface directly underlying the backside of the semiconductor element is made thinner leaving the un-diced substrate peripheral portion.

2. The fabrication method of a silicon carbide semiconductor element according to claim 1, wherein processes of reactive ion etching (RIE) and sacrificial oxidation are added for removing damage occurring with the forming of the one or more slit-shaped grooves.

3. A silicon carbide semiconductor element including a drift layer playing a role of retaining a high withstand voltage on a front side of a semiconductor substrate of silicon carbide and including an ohmic electrode on a backside, wherein the semiconductor substrate has a substrate resistance reduced by providing one or more slit-shaped grooves in an element active region on a surface on a side opposite of the drift layer, and the one or more slit-shaped grooves are provided from a furthest most peripheral end of the semiconductor substrate in a direction which is perpendicular to the surface of the semiconductor substrate contacting the drift layer, and are formed with a substrate end remaining at least on a side opposite of the furthest most peripheral end of the semiconductor substrate so as to maintain an un-diced substrate peripheral portion; and a distance between the one or more slit-shaped grooves is made smaller than a thickness of dicing such that an entire surface directly underlying the backside of the semiconductor element is made thinner leaving the un-diced substrate peripheral portion.

* * * * *